(12) United States Patent
Kuriki et al.

(10) Patent No.: US 7,878,631 B2
(45) Date of Patent: Feb. 1, 2011

(54) LIQUID JET HEAD, A LIQUID JET APPARATUS AND A PIEZOELECTRIC ELEMENT

(75) Inventors: Akira Kuriki, Shiojiri (JP); Yuka Yonekura, Chino (JP)

(73) Assignee: Seiko Epson Corporation, Shinjuku-ku, Tokyo (JP)

( * ) Notice: Subject to any disclaimer, the term of this patent is extended or adjusted under 35 U.S.C. 154(b) by 124 days.

(21) Appl. No.: 12/408,492

(22) Filed: Mar. 20, 2009

(65) Prior Publication Data

US 2009/0237465 A1  Sep. 24, 2009

(30) Foreign Application Priority Data

Mar. 21, 2008  (JP) .............................. 2008-074720

(51) Int. Cl.
*B41J 2/045* (2006.01)

(52) U.S. Cl. ....................................................... 347/68

(58) Field of Classification Search .................. 347/68, 347/69, 70–72; 400/124.14, 124.16; 310/311, 310/324, 327, 358, 365
See application file for complete search history.

(56) References Cited

U.S. PATENT DOCUMENTS

| 6,103,072 | A  | * | 8/2000 | Nishiwaki et al. ...... 204/192.18 |
| 6,284,434 | B1 | * | 9/2001 | Kamei et al. ................ 430/319 |
| 2006/0146097 | A1 | * | 7/2006 | Fujii et al. .................... 347/68 |

FOREIGN PATENT DOCUMENTS

JP  2001-274472 A  10/2001

* cited by examiner

*Primary Examiner*—K. Feggins
(74) *Attorney, Agent, or Firm*—Townsend and Townsend and Crew, LLP

(57) ABSTRACT

A piezoelectric layer held between a first electrode on a substrate side and a second electrode formed on a surface of the piezoelectric layer facing away from the first electrode is formed of a ferroelectric material with a perovskite crystal structure, and the ratio of the surface roughness of the piezoelectric layer to the surface roughness of the first electrode falls within the range of 0.58 to 1.60.

4 Claims, 10 Drawing Sheets

LIQUID JET HEAD, A LIQUID JET APPARATUS AND A PIEZOELECTRIC ELEMENT

CROSS REFERENCES TO RELATED APPLICATIONS

The present application claims priority based on Japanese Patent Application No. 2008-74720 filed on Mar. 21, 2008, which is incorporated herein.

BACKGROUND OF THE INVENTION

1. Field of the Invention

The present invention relates to liquid jet heads, liquid jet apparatuses, and piezoelectric elements.

2. Description of the Related Art

A known piezoelectric element used in a liquid jet head is constituted of, for example, a pair of electrodes and a piezoelectric layer held between these electrodes.

For example, a ferroelectric with a perovskite crystal structure is used for the piezoelectric layer (piezoelectric thin film) constituting the piezoelectric element. The piezoelectric thin film is formed by, for example, forming a piezoelectric precursor film on the lower electrode by the sol-gel process and firing the piezoelectric precursor film, as disclosed in, for example, Japanese Unexamined Patent Application Publication No. 2001-274472.

The piezoelectric layer thus formed shows considerable variations in, for example, crystal conditions, such as crystal grain size, due to differences in production conditions, and also shows variations in surface roughness due to the variations in crystal conditions. This piezoelectric layer has a problem in that a crack can occur in the piezoelectric layer during the driving of the piezoelectric element, depending on the crystal conditions of the piezoelectric layer. The inventors have found that the problem of cracking has some correlation with the relationship between the surface roughness of the lower electrode constituting the piezoelectric element and the surface roughness of the piezoelectric layer.

This problem arises not only in piezoelectric elements mounted on liquid jet heads, such as ink jet recording heads, but also in piezoelectric elements mounted on other devices.

SUMMARY OF THE INVENTION

Accordingly, the present invention has been made to solve at least part of the above problem and can be realized as the following embodiment or application.

A liquid jet head includes a piezoelectric element including a lower electrode formed on a channel-forming substrate having a pressure-generating chamber communicating with a nozzle that ejects liquid droplets, a piezoelectric layer formed on the lower electrode, and an upper electrode formed on the piezoelectric layer, and is characterized in that the piezoelectric layer is formed of a ferroelectric material with a perovskite crystal structure and that the ratio of the surface roughness of the piezoelectric layer to the surface roughness of the lower electrode falls within the range of 0.58 to 1.60.

Other features and objects of the present invention will become apparent from a reading of the description in the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

At least the following items will become apparent from the description in the present specification and the illustration in the accompanying drawings.

One application of the present invention is a liquid jet head including a piezoelectric element including a lower electrode formed on a channel-forming substrate having a pressure-generating chamber communicating with a nozzle that ejects liquid droplets, a piezoelectric layer formed on the lower electrode, and an upper electrode formed on the piezoelectric layer. The piezoelectric layer is formed of a ferroelectric material with a perovskite crystal structure, and the ratio of the surface roughness of the piezoelectric layer to the surface roughness of the lower electrode falls within the range of 0.58 to 1.60.

This structure prevents a crack from occurring in the piezoelectric layer as a result of driving of the piezoelectric element, presumably because the piezoelectric layer is in good crystal conditions.

The expression "on a substrate" is not an expression only indicating the case of direct contact with the substrate; it encompasses the case where some member is disposed between the substrate and the lower electrode.

The surface roughnesses of the piezoelectric layer and the lower electrode are values measured with, for example, an atomic force microscope. This allows the surface roughnesses of the piezoelectric layer and the lower electrode to be relatively accurately measured.

Another embodiment is a liquid jet apparatus characterized by including the above liquid jet head. This realizes a liquid jet apparatus with superior reliability.

A further embodiment is a piezoelectric element including a lower electrode formed on a substrate, a piezoelectric layer formed on the lower electrode, and an upper electrode formed on the piezoelectric layer and characterized in that the piezoelectric layer is formed of a ferroelectric material with a perovskite crystal structure and that the ratio of the surface roughness of the piezoelectric layer to the surface roughness of the lower electrode falls within the range of 0.58 to 1.60.

This prevents a crack from occurring in the piezoelectric layer as a result of driving of the piezoelectric element, presumably because the piezoelectric layer is in good crystal conditions.

The expression "on a substrate" is not an expression only indicating the case of direct contact with the substrate; it encompasses the case where some member is disposed between the substrate and the lower electrode.

Preferred embodiments of the present invention will now be described with reference to the drawings. The embodiments described below are presented merely as examples of the present invention; not all of the structures described therein are essential elements of the present invention.

PREFERRED EMBODIMENTS

Embodiments will now be described with reference to the drawings.

First Embodiment

Figure 1:
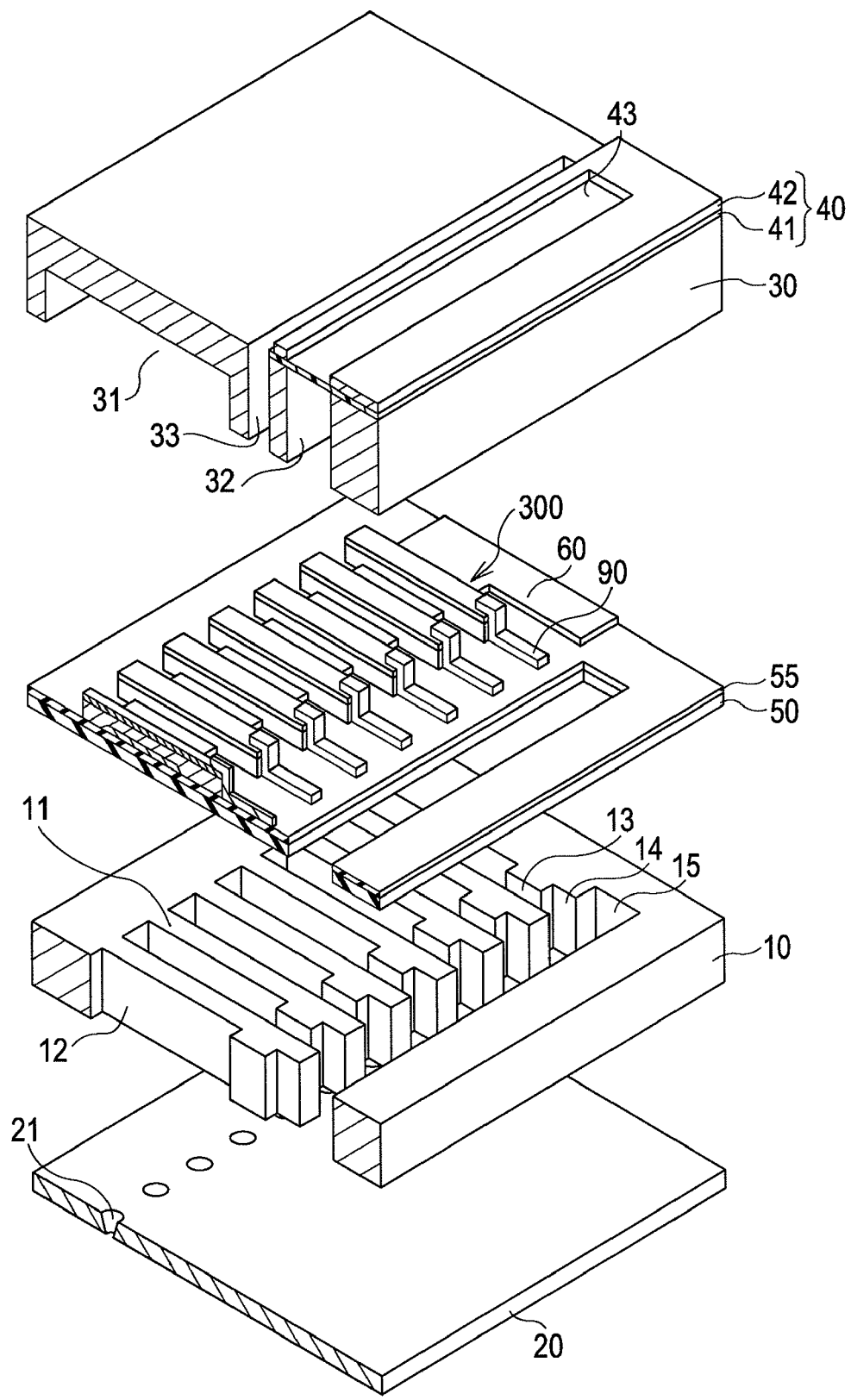
FIG. 1 is an exploded perspective view of a recording head according to a first embodiment.
Figure 2:
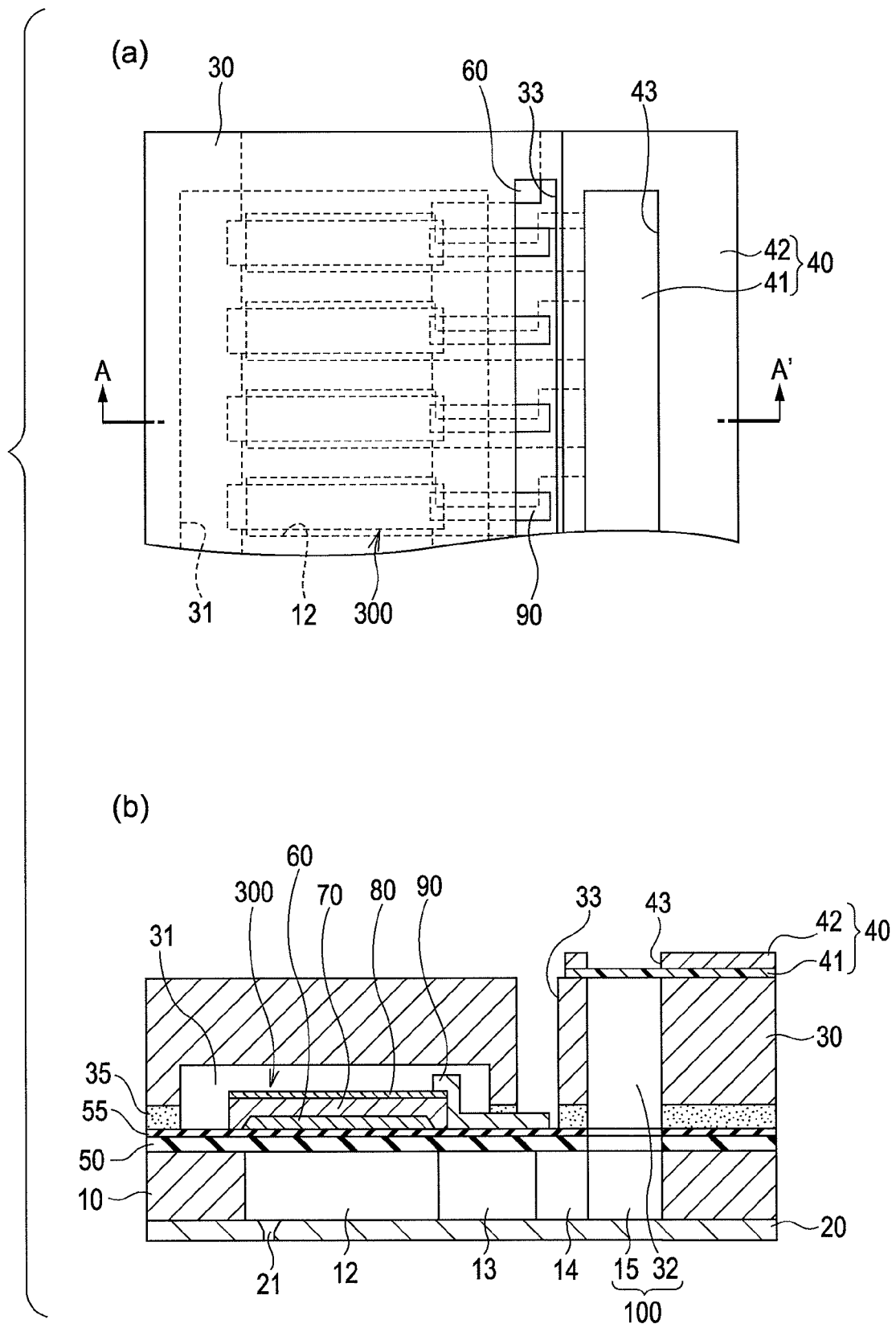
FIG. 2 shows a plan view and a sectional view of the recording head according to the first embodiment.
Figure 3:
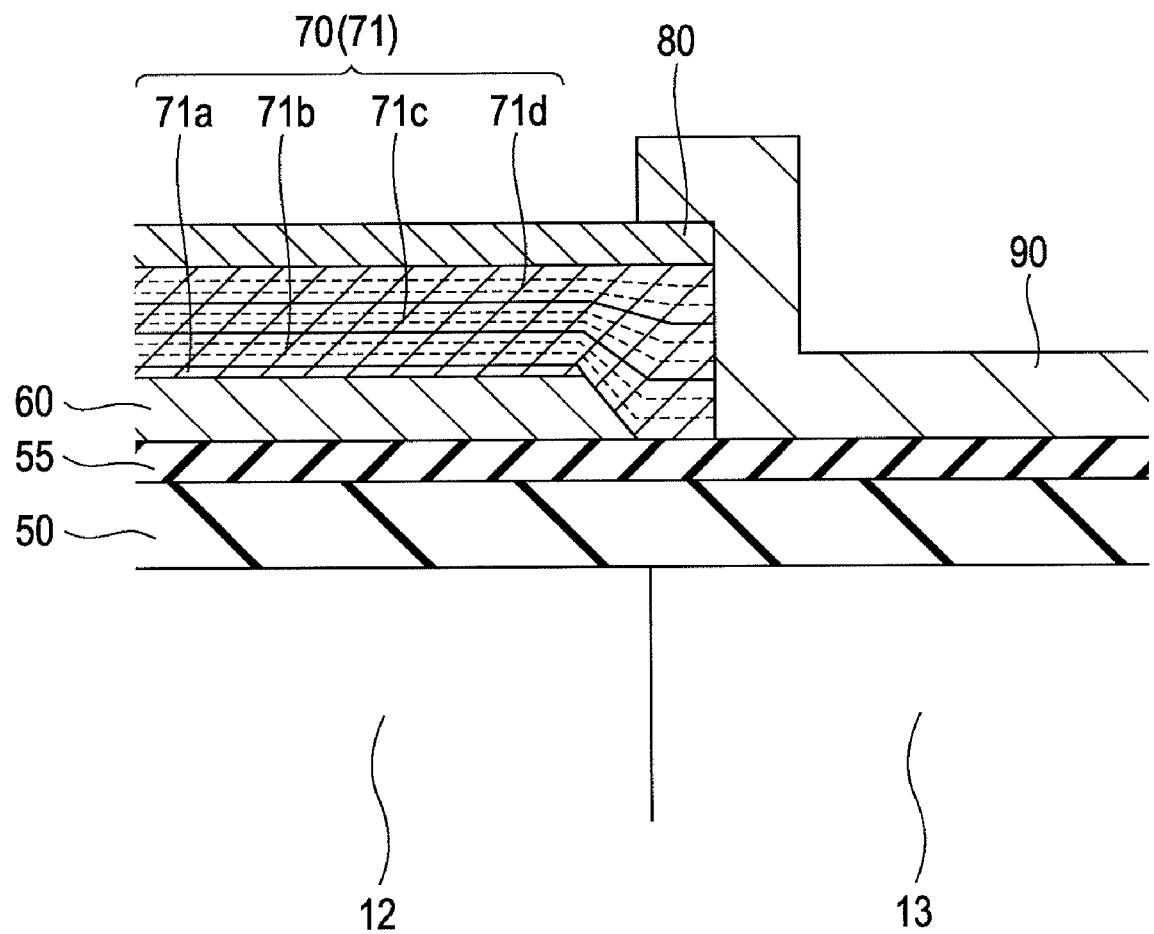
FIG. 3 is a sectional view showing the layer structure of piezoelectric elements according to the first embodiment.

FIG. 1 is an exploded perspective view schematically showing the structure of an ink jet recording head serving as an example of a liquid jet head produced by a production method according to a first embodiment of the present invention. FIG. 2(a) is a plan view of a relevant part of the ink jet recording head. FIG. 2(b) is a sectional view taken along line A-A' of FIG. 2(a). FIG. 3 is a schematic diagram showing the layer structure of piezoelectric elements.

As shown, a channel-forming substrate 10 is a monocrystalline silicon substrate with a (110) crystal plane orientation that has an elastic film 50 formed of an oxide film on one surface thereof. The channel-forming substrate 10 has a plurality of pressure-generating chambers 12 formed by anisotropically etching the other surface thereof such that they are defined by a plurality of partitions 11 and are arranged side by side in the width direction (lateral direction) thereof. In addition, ink supply channels 13 and communication channels 14 are defined by the partitions 11 at ends of the pressure-generating chambers 12 of the channel-forming substrate 10 on one side in the longitudinal direction thereof. In addition, a communication portion 15 is formed at ends of the communication channels 14 so as to constitute part of a reservoir 100 serving as a common ink chamber for the individual pressure-generating chambers 12.

In addition, a nozzle plate 20 is bonded to the orifice side of the channel-forming substrate 10 with, for example, an adhesive or a heat-fusible film such that nozzles 21 formed in the nozzle plate 20 communicate with the respective pressure-generating chambers 12 near the ends of the pressure-generating chambers 12 facing away from the ink supply channels 13. The nozzle plate 20 is formed of, for example, glass ceramic, a monocrystalline silicon substrate, or stainless steel.

On the other hand, the elastic film 50, formed of an oxide film, as described above, is formed on the side of the channel-forming substrate 10 opposite the orifice surface thereof, and an insulating film 55 formed of an oxide film of a material different from the elastic film 50 is formed on the elastic film 50. In addition, piezoelectric elements 300 constituted of a lower electrode film 60, piezoelectric layers 70, and upper electrode films 80 are formed on the insulating film 55. In general, of the pair of electrodes constituting the piezoelectric elements 300, one electrode functions as a common electrode shared by the plurality of piezoelectric elements 300, whereas the other electrode functions as separate electrodes independent for the individual piezoelectric elements 300. In this embodiment, for example, the lower electrode film 60 serves as the common electrode for the piezoelectric elements 300, whereas the upper electrode films 80 serve as the separate electrodes for the individual piezoelectric elements 300. Naturally, no problem arises if the separate electrodes and the common electrode are reversed in view of arranging a drive circuit and wiring. In this embodiment, the elastic film 50, the insulating film 55, and the lower electrode film 60 serve as a diaphragm, although naturally the structure is not limited thereto. For example, without the elastic film 50 and the insulating film 55, the lower electrode film 60 alone may serve as a diaphragm. Alternatively, the piezoelectric elements 300 themselves may serve substantially as a diaphragm.

The lower electrode film 60 constituting the piezoelectric elements 300 is patterned near the ends of the pressure-generating chambers 12 and is continuously provided in the direction in which the pressure-generating chambers 12 are arranged side by side. In addition, the end surfaces of the lower electrode film 60 in the region corresponding to the pressure-generating chambers 12 are inclined surfaces inclined at a predetermined angle with respect to the insulating film 55.

The piezoelectric layers 70 are provided independently for the individual pressure-generating chambers 12 and, as shown in FIG. 3, are constituted of a plurality of ferroelectric films 71 (71a to 71d). Of the plurality of ferroelectric films 71, the bottommost layer, namely, the first ferroelectric film 71a, is disposed only on the lower electrode film 60, and its end surfaces are inclined surfaces continuous with the end surfaces of the lower electrode film 60. The second to fourth ferroelectric films 71b to 71d, formed on the first ferroelectric film 71a, cover the inclined end surfaces thereof and reach the top of the insulating film 55. The lower electrode film 60 may also be formed so that the ends thereof reach the ends of the piezoelectric elements 300 without being covered by the second to fourth ferroelectric films 71b to 71d.

The upper electrode films 80, like the piezoelectric layers 70, are provided independently for the individual pressure-generating chambers 12. In addition, for example, lead electrodes 90 formed of, for example, gold (Au) and reaching the top of the insulating film 55 are connected to the individual upper electrode films 80.

In the present invention, the ratio of the surface roughness of the piezoelectric layers 70 constituting the piezoelectric elements 300 to the surface roughness of the layer underlying the piezoelectric layers 70, namely, the lower electrode film 60 (hereinafter referred to as "surface roughness ratio"), falls within the range of 0.58 to 1.60. The surface roughness of the lower electrode film 60 is a value measured immediately after the lower electrode film 60 is formed by, for example, sputtering (before the piezoelectric layers 70 are formed), as described later, and the surface roughness of the piezoelectric layers 70 is a value measured immediately after the piezoelectric layers 70, constituted of the plurality of ferroelectric films 71, are formed by firing ferroelectric precursor films 72 (before the upper electrode films 80 are formed), as described later. The term "surface roughness" refers specifically to arithmetic average roughness Ra (JIS B 0601), although instead of arithmetic average roughness Ra it is possible to use, for example, a value Sa determined from the results of measurement of the surface heights of the lower electrode film 60 and the piezoelectric layers 70 at a plurality of points within a predetermined range, based on the following equation:

$$Sa = \Sigma |Z(i) - \langle Z \rangle| / N \quad (1)$$

where Z(i) is the bump height or dip depth at a measurement point i, <Z> is the average for all measurement points, and N is the number of measurement points.

In addition, the method for measuring the surface roughness of the lower electrode film 60 and the piezoelectric layers 70 is not specifically limited; for example, an atomic force microscope (AFM) may be used, which allows the surface roughness to be relatively accurately measured.

Thus, if the surface roughness ratio falls within the above range, a crack can be prevented from occurring in the piezoelectric layers 70 as a result of driving of the piezoelectric elements 300. This is probably because, if the surface roughness ratio falls within the above range, the piezoelectric layers 70 are in good crystal conditions and also have good adhesion to the underlying layer.

In the present invention, the structure of the piezoelectric layers 70 is substantially determined by specifying the above surface roughness ratio. Although it is possible to specify the surface roughness of the piezoelectric layers 70 themselves, the surface roughness of the piezoelectric layers 70 may show variations in measurement. For example, although the surface roughness of the piezoelectric layers 70 can be relatively accurately measured by measuring the surface roughness with AFM, it may show variations in measurement, depending on the conditions and resolution of the AFM. In contrast, specifying the ratio of the surface roughness of the piezoelectric layers 70 to that of the lower electrode film 60 permits some degree of variation in the measurement of the surface roughness of the piezoelectric layers 70.

A protective substrate 30 is bonded with an adhesive 35 to the channel-forming substrate 10 on which the piezoelectric elements 300 are formed and has a piezoelectric-element accommodating portion 31 for protecting the piezoelectric elements 300 in a region opposite the piezoelectric elements 300. The piezoelectric-element accommodating portion 31 only needs to have a sufficient space not to obstruct the movement of the piezoelectric elements 300, and the space may be either sealed or unsealed.

The protective substrate 30 also has a reservoir portion 32 in a region opposite the communication portion 15, and the reservoir portion 32 communicates with the communication portion 15 of the channel-forming substrate 10 to constitute the reservoir 100, which serves as the common ink chamber for the individual pressure-generating chambers 12, as described above. The protective substrate 30 also has a through-hole 33 extending therethrough in the thickness direction in a region between the piezoelectric-element accommodating portion 31 and the reservoir portion 32, with part of the lower electrode film 60 and ends of the lead electrodes 90 exposed in the through-hole 33.

The material used for the protective substrate 30 is preferably a material with substantially the same thermal expansion coefficient as the channel-forming substrate 10, for example, a glass or ceramic material; for example, it is preferable to use the same material as the channel-forming substrate 10, namely, a monocrystalline silicon substrate.

A compliant substrate 40 constituted of a sealing film 41 and a fixing plate 42 is bonded to the protective substrate 30. The sealing film 41, formed of a flexible material with low rigidity, seals one side of the reservoir portion 32. The fixing plate 42, on the other hand, is formed of a hard material such as metal. Because an opening 43 from which the fixing plate 42 is completely removed in the thickness direction is formed in a region opposite the reservoir 100, one side of the reservoir 100 is sealed only with the flexible sealing film 41. In addition, although not shown, a drive circuit for driving the piezoelectric elements 300 is fixed to the protective substrate 30 and is electrically connected to the lead electrodes 90 via connection wiring, such as conductive wires, extending through the through-hole 33.

In the ink jet recording head according to this embodiment, after the internal space, from the reservoir 100 to the nozzles 21, is filled with ink supplied from external ink-supplying means (not shown), drive signals are input to the piezoelectric elements 300, which correspond to the pressure-generating chambers 12, via the upper electrode films 80 in response to recording signals from the drive circuit, so that the piezoelectric elements 300 undergo flexural deformation to increase the internal pressures of the individual pressure-generating chambers 12, thus ejecting ink droplets from the nozzles 21.

Figure 4:
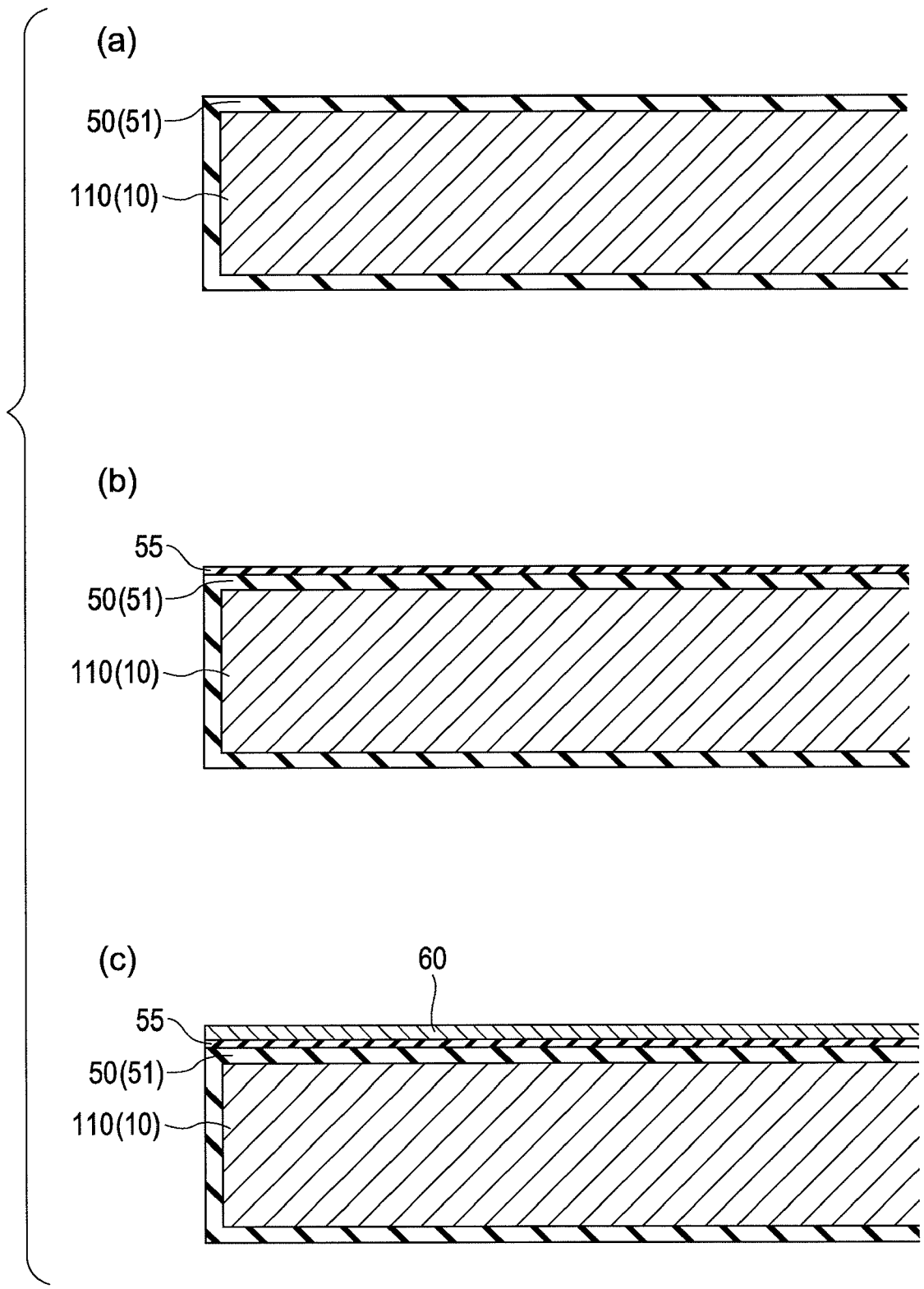
FIG. 4 shows sectional views illustrating a process of producing the recording head according to the first embodiment.
Figure 5:
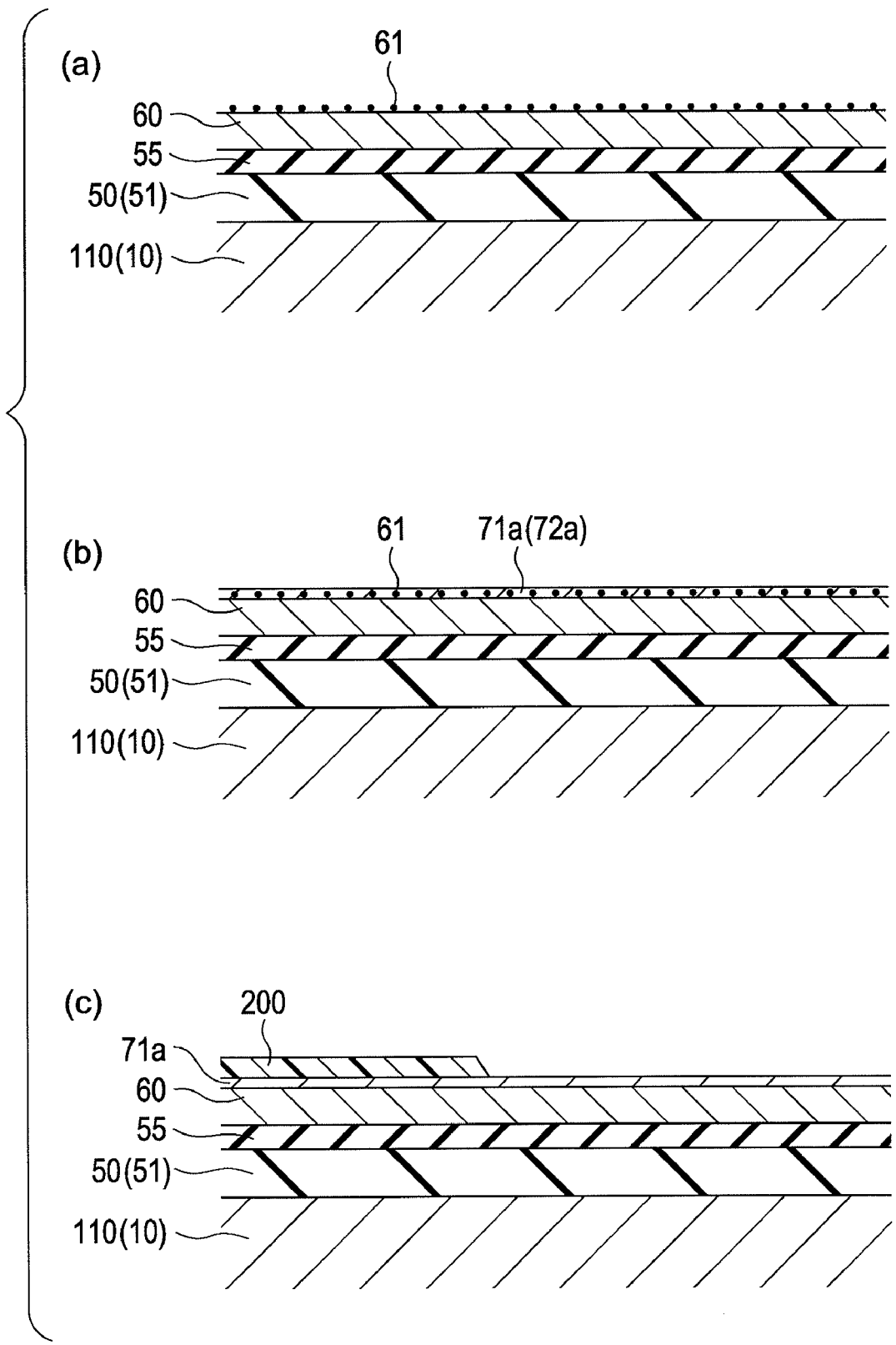
FIG. 5 shows sectional views illustrating the process of producing the recording head according to the first embodiment.
Figure 6:
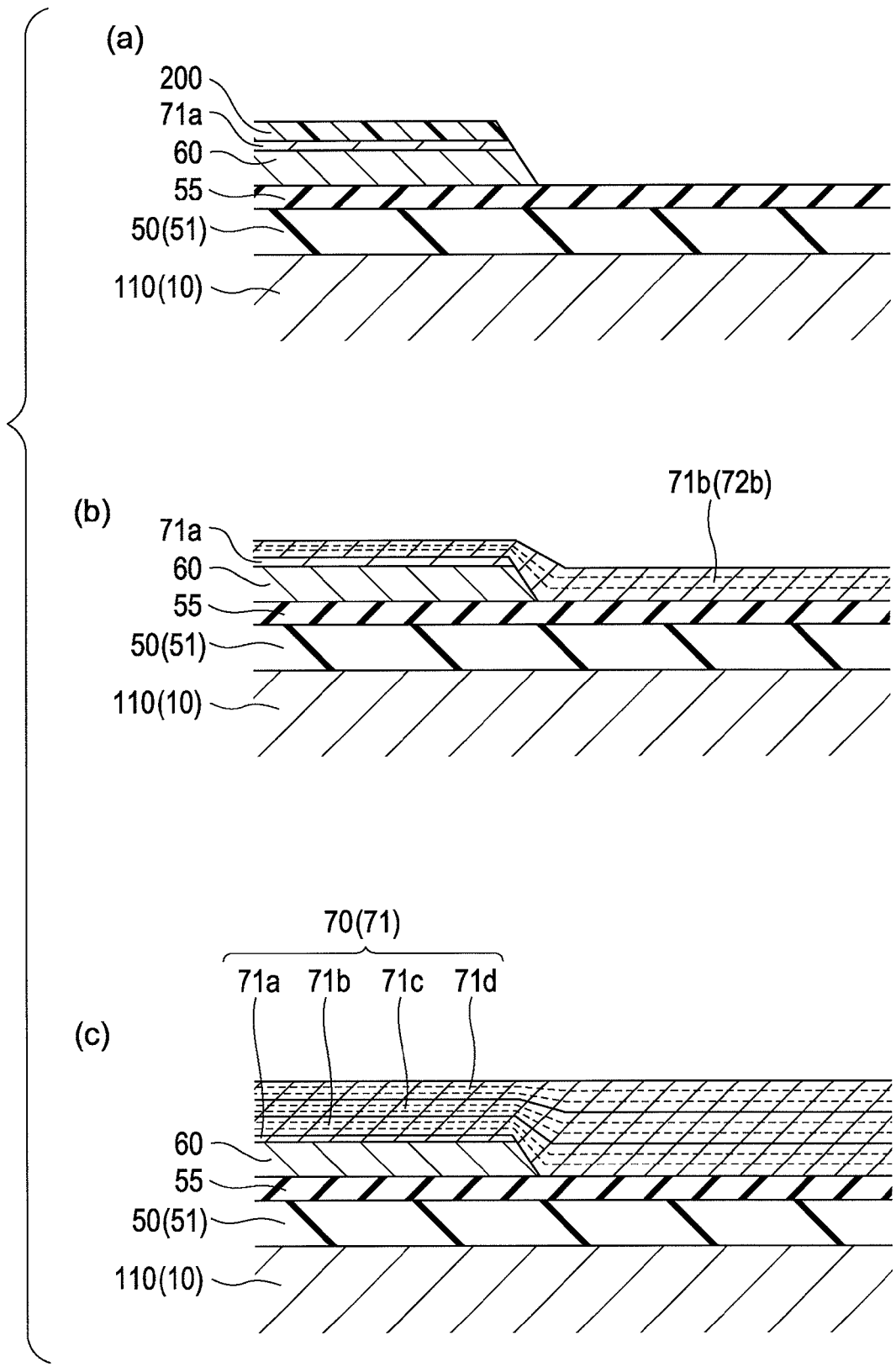
FIG. 6 shows sectional views illustrating the process of producing the recording head according to the first embodiment.
Figure 7:
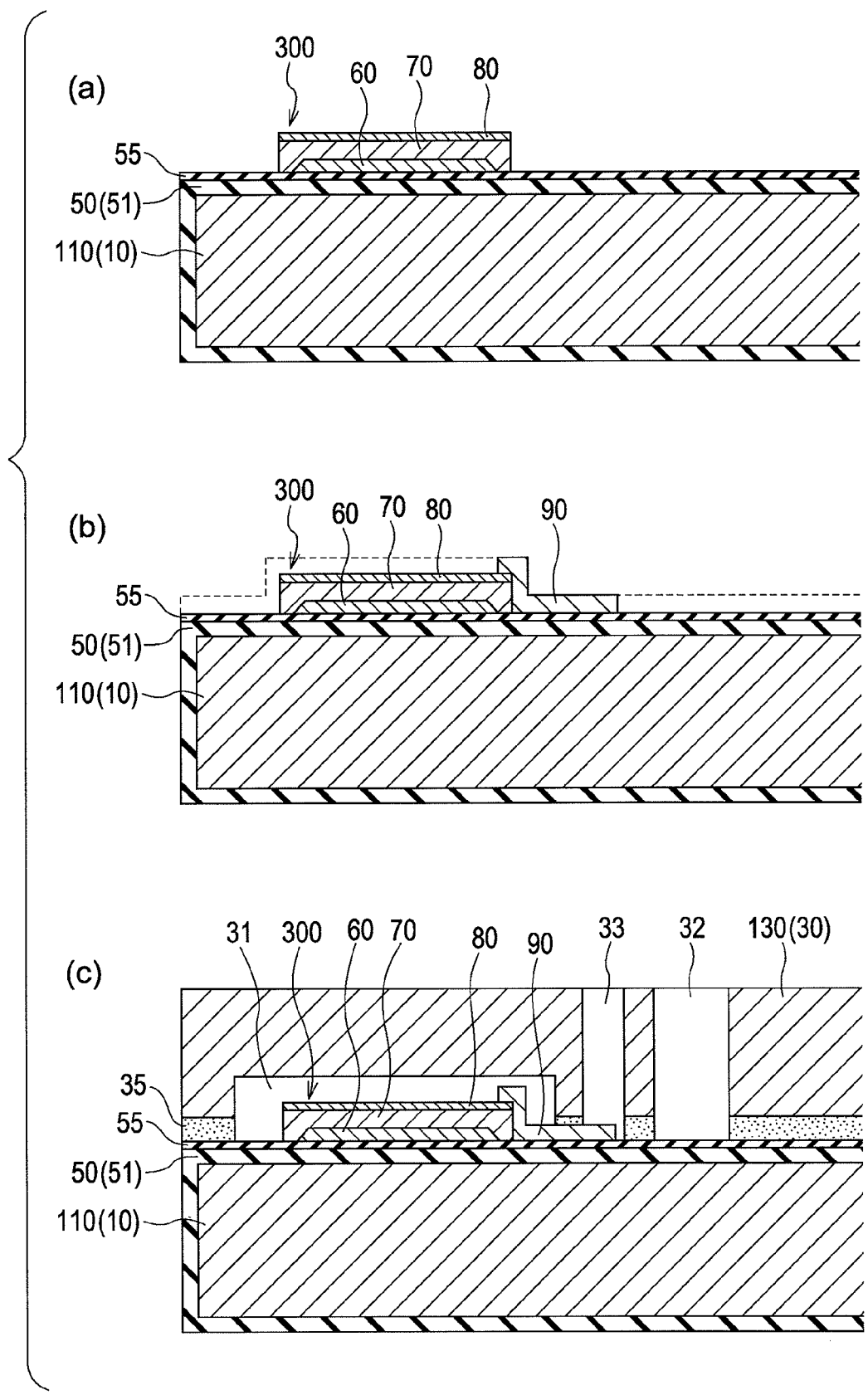
FIG. 7 shows sectional views illustrating the process of producing the recording head according to the first embodiment.
Figure 8:
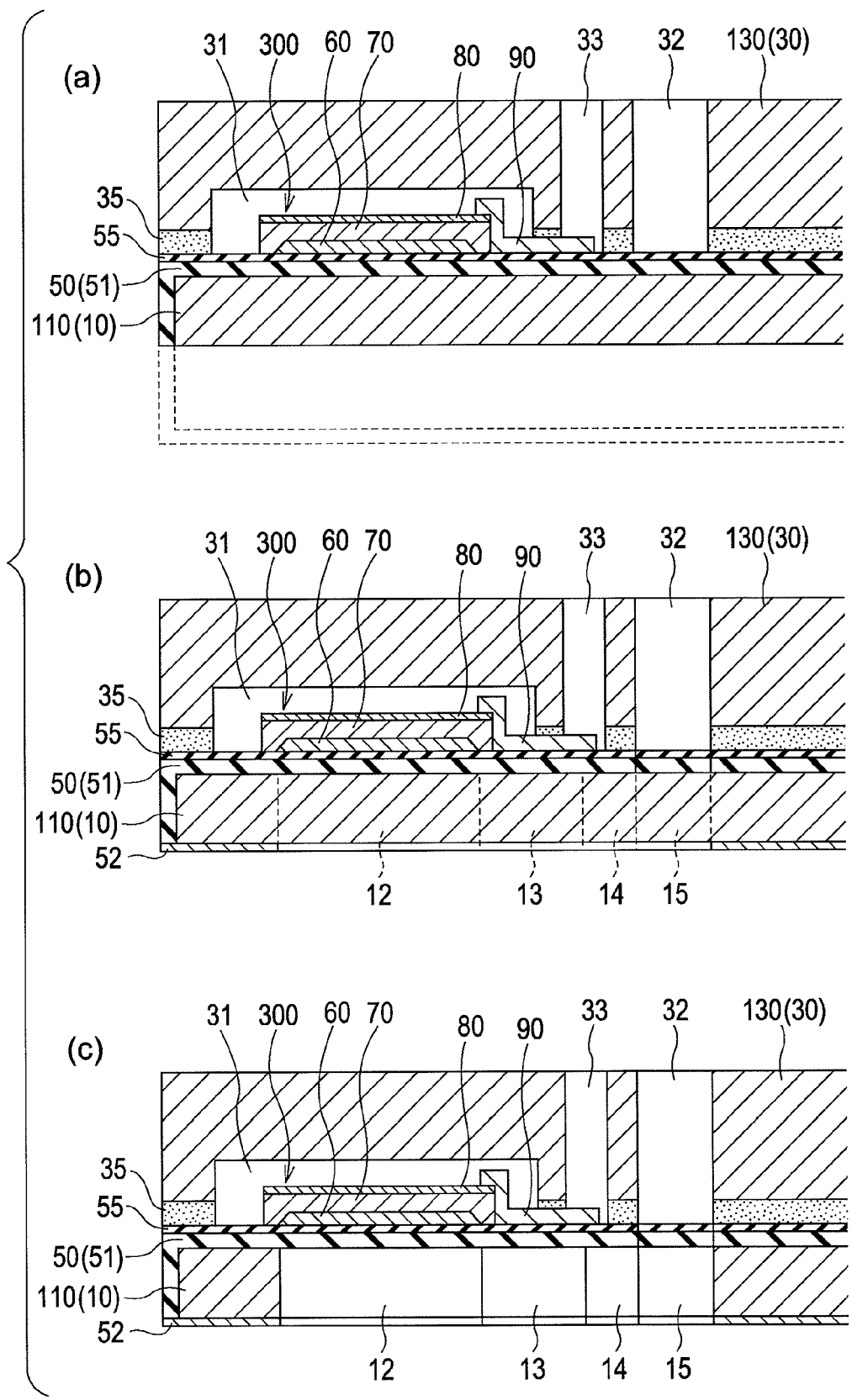
FIG. 8 shows sectional views illustrating the process of producing the recording head according to the first embodiment.

A method for producing the ink jet recording head will now be described with reference to FIGS. 4 to 8. First, as shown in FIG. 4(a), a channel-forming substrate wafer 110 that is a silicon wafer is thermally oxidized in a diffusion furnace at about 1,100° C. to form a silicon dioxide film 51 constituting the elastic film 50 on a surface thereof. The channel-forming substrate wafer 110 used is, for example, a silicon wafer that is relatively thick, namely, about 625 μm thick, and that has high rigidity.

Then, as shown in FIG. 4(b), a zirconium oxide insulating film 55 is formed on the elastic film 50 (the silicon dioxide film 51). Specifically, the zirconium oxide insulating film 55 is formed by forming a zirconium (Zr) layer on the elastic film 50 (the silicon dioxide film 51) by, for example, DC sputtering or RF sputtering and then thermally oxidizing the zirconium layer.

Then, as shown in FIG. 4(c), a lower electrode film 60 containing, for example, platinum and iridium is formed over the entire surface of the insulating film 55 by, for example, sputtering. The surface roughness of the lower electrode film 60 described above is measured immediately after the lower electrode film 60 is formed. The surface roughness of the lower electrode film 60 varies under various sputtering conditions, including time, temperature, and pressure. That is, a lower electrode film 60 with a desired surface roughness can be formed by appropriately setting the various sputtering conditions.

Then, a piezoelectric layer 70 is formed on the lower electrode film 60. The piezoelectric layer 70, as described above, is formed by stacking the plurality of ferroelectric films 71a to 71d; in this embodiment, the ferroelectric films 71 are formed by the so-called sol-gel process. That is, each ferroelectric film 71 is formed by forming a ferroelectric precursor film 72 by dissolving and dispersing a organometallic compound in a catalyst and applying and drying the sol to convert it to gel; degreasing the ferroelectric precursor film 72 to remove organic constituents therefrom; and firing the ferroelectric precursor film 72 to facilitate crystallization.

Specifically, first, as shown in FIG. 5(a), seed crystals (layer) 61 of titanium or titanium oxide are formed on the lower electrode film 60 by sputtering. Then, a ferroelectric material is applied by, for example, spin coating to form an uncrystallized ferroelectric precursor film 72a with a predetermined thickness, as shown in FIG. 5(b). The ferroelectric precursor film 72a is then dried at a predetermined temperature for a predetermined period of time to evaporate the solvent. The temperature for drying the ferroelectric precursor film 72a is, for example, preferably 150° C. to 200° C., more preferably about 180° C. In addition, the drying time is, for example, preferably 5 to 15 minutes, more preferably about 10 minutes.

Then, the dried ferroelectric precursor film 72a is degreased at a predetermined temperature. The term "degreasing" used herein means removing organic constituents from the ferroelectric precursor film 72a as, for example, $NO_2$, $CO_2$, or $H_2O$. The temperature for heating the channel-forming substrate wafer 110 during the degreasing is preferably about 300° C. to 500° C. If the temperature is too high, the ferroelectric precursor film 72a starts crystallization; if the temperature is too low, the degreasing cannot be sufficiently performed.

After the ferroelectric precursor film 72a is degreased, the channel-forming substrate wafer 110 is inserted into, for example, a rapid thermal annealing (RTA) apparatus and is fired at a predetermined temperature for a predetermined period of time to facilitate crystallization, so that the first ferroelectric film 71a is formed on the lower electrode film 60.

After the first ferroelectric film 71a is formed, the lower electrode film 60 and the first ferroelectric film 71a are simultaneously patterned. At this time, the patterning is performed so that the end surfaces of the lower electrode film 60 and the first ferroelectric film 71a are processed into inclined surfaces inclined at a predetermined angle. Specifically, as shown in FIG. 5(c), a resist is applied onto the first ferroelectric film 71a and is developed by exposure through a mask with a predetermined shape to form a resist film 200 with a predetermined pattern. Then, as shown in FIG. 6(a), the first ferroelectric film 71a and the lower electrode film 60 are patterned by ion milling with the resist film 200 as a mask while the resist film 200 is gradually etched together with the first ferroelectric film 71a and the lower electrode film 60, so that the end surfaces of the lower electrode film 60 and the first ferroelectric film 71a are processed into inclined surfaces.

Then, as shown in FIG. 6(b), another ferroelectric precursor film 72b with a predetermined thickness is formed on the first ferroelectric film 71a. In this embodiment, the ferroelectric precursor film 72b is formed by repeating the above applying, drying, and degreasing steps three times. Subsequently, the ferroelectric precursor film 72b is fired to form the second ferroelectric film 71b.

Then, as shown in FIG. 6(c), a third ferroelectric precursor film 72c is formed on the second ferroelectric film 71b by repeating the steps of applying, drying, and degreasing the ferroelectric material three times in the same manner as the above second ferroelectric film 71b, and the third ferroelectric precursor film 72c is fired to form the third ferroelectric film 71c. Furthermore, the fourth ferroelectric film 71d is formed on the third ferroelectric film 71c in the same manner. Thus, the piezoelectric layer 70 constituted of the plurality of ferroelectric films 71a to 71d is formed. The thickness of the piezoelectric layer 70 thus formed is, for example, about 1,350 nm in this embodiment.

The heating apparatus used for firing the ferroelectric precursor films 72 is not specifically limited, although, for example, a rapid thermal annealing (RTA) apparatus is preferably used. In addition, before the second ferroelectric film 71b is formed, seed crystals (crystal layer) of titanium or titanium oxide may be formed again on the first ferroelectric film 71a.

The surface roughness of the piezoelectric layer 70 described above is measured immediately after the piezoelectric layer 70 is formed. The surface roughness of the piezoelectric layer 70 varies with, for example, differences in the conditions of the applying, drying, degreasing, and firing steps. That is, as in the case of the lower electrode film 60, a piezoelectric layer 70 with a desired surface roughness can be formed by appropriately setting various production conditions.

In the present invention, the production conditions of the lower electrode film 60 and the piezoelectric layer 70 are appropriately controlled so that the ratio of the surface roughness of the piezoelectric layer 70 to the surface roughness of the lower electrode film 60 (surface roughness ratio) falls within the range of 0.58 to 1.60. This allows formation of the piezoelectric layer 70 in good crystal conditions and prevents a crack from occurring in the piezoelectric layer 70 as a result of driving of the piezoelectric elements 300. In particular, a crack is prevented from occurring in the piezoelectric layer 70 more effectively as the surface roughness ratio is higher, that is, as the piezoelectric layer 70 has a rougher surface with a larger crystal grain size. As a result, an ink jet recording head with superior reliability can be realized.

The material used for the piezoelectric layer 70 constituting the piezoelectric elements 300 is, for example, a ferroelectric piezoelectric material such as lead zirconate titanate (PZT) or a relaxor ferroelectric prepared by doping it with a metal such as niobium, nickel, magnesium, bismuth, or yttrium. Examples of the composition, which may be appropriately selected in terms of, for example, the characteristics and application of the piezoelectric elements 300, include $PbTiO_3$ (PT), $PbZrO_3$ (PZ), $Pb(ZrxTi1-x)O_3$ (PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/2}Ta_{1/2})O_3$—$PbTiO_3$ (PST-PT), $Pb(Sc_{1/2}Nb_{1/2})O_3$—$PbTiO_3$ (PSN-PT), $BiScO_3$—$PbTiO_3$ (BS-PT), and $BiYbO_3$—$PbTiO_3$ (BY-PT). In addition, although the individual ferroelectric films 71 constituting the piezoelectric layer 70 are formed by the sol-gel process in this embodiment, the method used is not limited thereto; for example, they may be formed by so-called metal-organic decomposition (MOD), in which a colloidal solution prepared by dissolving an organometallic compound, such as a metal alkoxide, in an alcohol and adding, for example, a hydrolysis inhibitor is applied onto an object and is dried and fired to form a film.

After the piezoelectric layer 70 constituted of the plurality of ferroelectric films 71a to 71d is formed, as shown in FIG. 7(a), for example, an iridium (Ir) upper electrode film 80 is formed, and the piezoelectric layer 70 and the upper electrode film 80 are pattered to form the piezoelectric elements 300 in regions opposite the individual pressure-generating chambers 12.

After the piezoelectric elements 300 are formed, as shown in FIG. 7(b), a metal layer of gold (Au) is formed over the entire surface of the channel-forming substrate 10 and is pattered through a mask pattern (not shown) formed of, for example, a resist to form the lead electrodes 90 for the individual piezoelectric elements 300.

Then, as shown in FIG. 7(c), a protective substrate wafer 130 in which a plurality of protective substrates 30 are integrally formed is bonded to the channel-forming substrate wafer 110 with the adhesive 35. The protective substrate wafer 130 has piezoelectric-element accommodating portions 31, reservoir portions 32, and so on formed in advance. The protective substrate wafer 130 is, for example, a silicon wafer with a thickness of about 400 μm; bonding the protective substrate wafer 130 significantly improves the rigidity of the channel-forming substrate wafer 110.

Then, as shown in FIG. 8(a), after the channel-forming substrate wafer 110 is processed to a predetermined thickness, as shown in FIG. 8(b), for example, a silicon nitride (SiN) protective film 52 is newly formed on the channel-forming substrate wafer 110 and is patterned into a predetermined shape. Then, as shown in FIG. 8(c), the channel-forming substrate wafer 110 is subjected to anisotropic etching (wet etching) with the protective film 52 as a mask to form pressure-generating chambers 12, ink supply channels 13, communication channels 14, and communication portions 15 in the channel-forming substrate wafer 110.

Subsequently, unnecessary marginal portions of the channel-forming substrate wafer 110 and the protective substrate wafer 130 are removed by cutting, for example, dicing. The nozzle plate 20 in which the nozzles 21 are formed is then bonded to the surface of the channel-forming substrate wafer 110 facing away from the protective substrate wafer 130, and the compliant substrate 40 is bonded to the protective substrate wafer 130. The channel-forming substrate wafer 110 and so on are divided into single-chip-sized channel-forming substrates 10 and so on as shown in FIG. 1, so that ink jet recording heads having the structure described above are produced.

Figure 9:
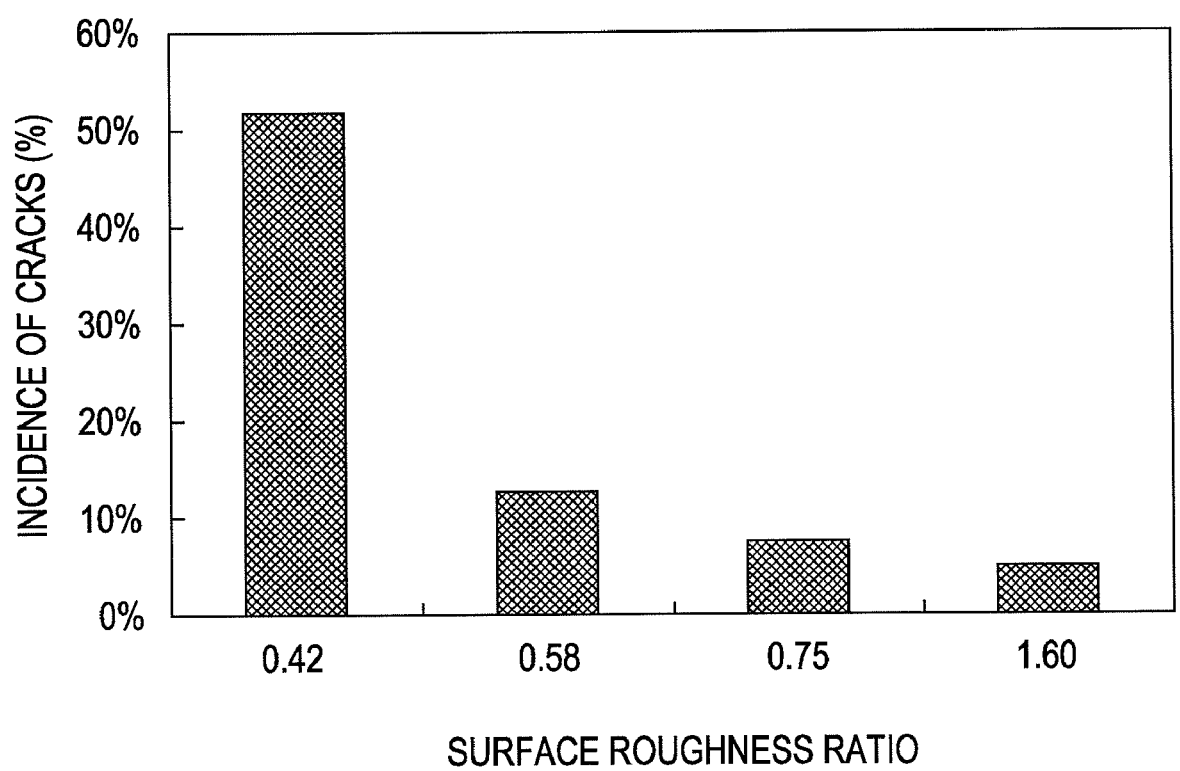
FIG. 9 is a graph showing the relationship between surface roughness ratio and incidence of cracks.

The results of a study on the relationship between the surface roughness ratio and the incidence of cracks in the piezoelectric layers 70 due to driving of the piezoelectric elements 300 for the ink jet recording heads thus produced will be described herein. Specifically, a plurality of ink jet recording heads including piezoelectric elements with different surface roughness ratios were produced, and after the piezoelectric elements of the individual ink jet recording heads were driven a predetermined number of times, the proportion of ink jet recording heads in which a crack occurred in the piezoelectric layers 70 was studied. FIG. 9 is a graph showing the results. The surface roughnesses of the lower electrode film 60 and the piezoelectric layers 70 were values Sa calculated from measurements taken with an atomic force microscope based on Equation (1) above.

As shown in FIG. 9, the incidence of cracks was extremely high, namely, about 50%, for a surface roughness ratio of less than 0.58, namely, 0.42, whereas the incidence of cracks was significantly low, namely, about 10%, for surface roughness ratios of 0.58 and more. In addition, the incidence of cracks in the piezoelectric layers 70 tended to decrease as the surface roughness ratio was higher, that is, as the piezoelectric layer 70 had a larger crystal grain size and a higher surface roughness. Hence, the surface roughness ratio is preferably as high as possible within the above range. A surface roughness ratio higher than the above range is difficult to achieve in practice.

Other Embodiments

While one embodiment of the present invention has been described above, the present invention is not limited to the above embodiment.

Figure 10:
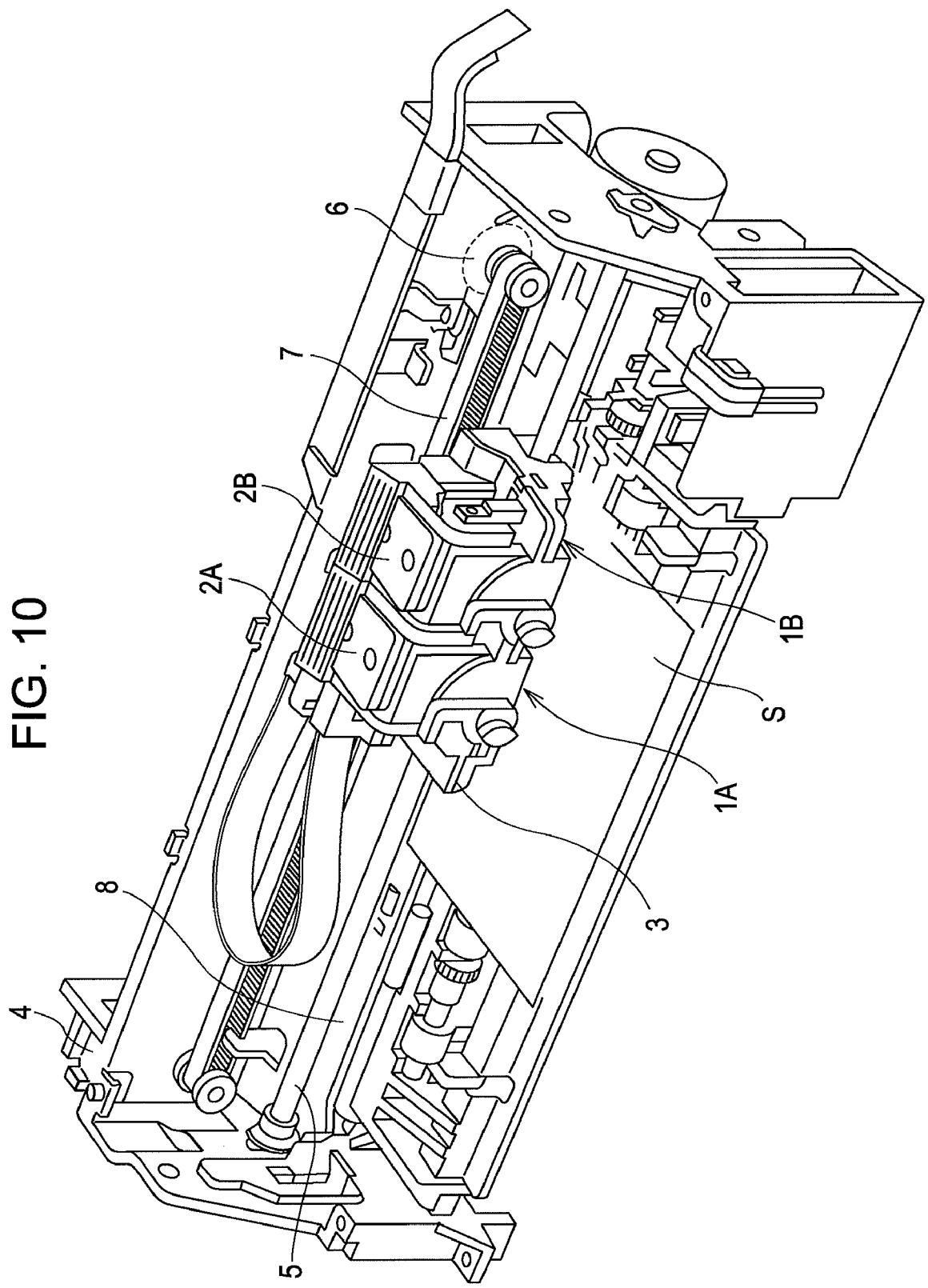
FIG. 10 is a schematic perspective view of a recording head according to one embodiment.

In addition, the above ink jet recording head is mounted on an ink jet recording apparatus, constituting part of a recording head unit having an ink channel communicating with, for example, an ink cartridge. FIG. 10 is a schematic diagram showing an example of the ink jet recording apparatus. As shown in FIG. 10, recording head units 1A and 1B including ink jet recording heads have attachable/detachable cartridges 2A and 2B, respectively, constituting ink-supplying means, and a carriage 3 on which the recording head units 1A and 1B are mounted is disposed on a carriage shaft 5 attached to an apparatus body 4 so as to be movable in the axial direction. The recording head units 1A and 1B eject, for example, a black ink composition and a color ink composition, respectively.

When a driving force is transmitted from a drive motor 6 to the carriage 3 via a plurality of gears (not shown) and a timing belt 7, the carriage 3 on which the recording head units 1A and 1B are mounted is moved along the carriage shaft 5. On the other hand, the apparatus body 4 has a platen 8 extending along the carriage shaft 5 so that a recording sheet S, a recording medium such as paper fed by, for example, a feed roller (not shown), is transported over the platen 8.

In addition, while an ink jet recording head is taken as an example of a head used for a liquid jet apparatus in the above embodiment, the present invention is broadly directed to all types of liquid jet heads; naturally, it can be applied to liquid jet heads that eject liquids other than ink. Other types of liquid jet heads include, for example, various recording heads used for image-recording apparatuses such as printers; colorant jet heads used for production of color filters such as for liquid crystal displays; electrode-material jet heads used for formation of electrodes such as for organic EL displays and field-emission displays (FED), and biological-organic-material jet heads used for production of biochips. In addition, it is obvious that the present invention can be applied not only to piezoelectric elements serving as actuators used for liquid jet heads, but also to piezoelectric elements mounted on any other apparatus, such as microphones, sounders, various vibrators, and transmitters.

The invention claimed is:

1. A liquid jet head comprising a piezoelectric element including a lower electrode formed on a channel-forming substrate having a pressure-generating chamber communicating with a nozzle that ejects liquid droplets, a piezoelectric layer formed on the lower electrode, and an upper electrode formed on the piezoelectric layer, wherein the piezoelectric layer is formed of a ferroelectric material with a perovskite crystal structure, and the ratio of the surface roughness of the piezoelectric layer to the surface roughness of the lower electrode falls within the range of 0.58 to 1.60.

2. The liquid jet head having the structure of claim 1, wherein the surface roughnesses of the piezoelectric layer and the lower electrode are values measured with an atomic force microscope.

3. A liquid jet apparatus comprising the liquid jet head of claim 1.

4. A piezoelectric element comprising a lower electrode formed on a substrate, a piezoelectric layer formed on the lower electrode, and an upper electrode formed on the piezoelectric layer, wherein the piezoelectric layer is formed of a ferroelectric material with a perovskite crystal structure, and the ratio of the surface roughness of the piezoelectric layer to the surface roughness of the lower electrode falls within the range of 0.58 to 1.60.

* * * * *